(12) United States Patent
Carter et al.

(10) Patent No.: US 7,145,923 B2
(45) Date of Patent: Dec. 5, 2006

(54) TUNEABLE LASER

(75) Inventors: Andrew Cannon Carter, Blisworth (GB); Douglas Reid, Rugby (GB); David James Robbins, Towcester (GB); Andrew Ward, Moulton (GB)

(73) Assignee: Bookham Technology PLC, Towcester (GB)

(*) Notice: Subject to any disclaimer, the term of this patent is extended or adjusted under 35 U.S.C. 154(b) by 325 days.

(21) Appl. No.: 10/485,427

(22) PCT Filed: Jul. 29, 2002

(86) PCT No.: PCT/GB02/03463

§ 371 (c)(1),
(2), (4) Date: Jan. 30, 2004

(87) PCT Pub. No.: WO03/012936

PCT Pub. Date: Feb. 13, 2003

(65) Prior Publication Data

US 2004/0218638 A1    Nov. 4, 2004

(30) Foreign Application Priority Data

Jul. 30, 2001 (GB) .................................. 0118412.6
Oct. 17, 2001 (GB) .................................. 0124921.8

(51) Int. Cl.
*H01S 3/10* (2006.01)
*H01S 3/08* (2006.01)

(52) U.S. Cl. ..................... 372/20; 372/96; 372/102
(58) Field of Classification Search ............ 372/20, 372/92–99, 102

See application file for complete search history.

(56) References Cited

U.S. PATENT DOCUMENTS 4,829,535 A * 5/1989 Utaka ................. 372/50.11

(Continued)

FOREIGN PATENT DOCUMENTS

CA            2228683            5/2002

(Continued)

OTHER PUBLICATIONS

Alibert, G. et al. "Subnanosecond tunable laser using a single electroabsorption tuning superstructure grating." *IEEE Photonics Technology Letters* 9(7):895-897 (1997).

(Continued)

*Primary Examiner*—Minsun Oh Harvey
*Assistant Examiner*—Phillip Nguyen
(74) *Attorney, Agent, or Firm*—Lahive & Cockfield, LLP; Anthony A. Laurentano, Esq.

(57) ABSTRACT

A tuneable laser has a gain section bounded at one end by a first reflector in the form of a distributed Bragg reflector adapted to produce a comb of reflective peaks and on the other end by a second Bragg reflector, the second Bragg reflector adapted to reflect at a plurality of wavelengths and being capable of being varied selectively through discrete segments so that one or more segments of the Bragg reflector can be tuned to a lower wavelength to reflect with a segment reflecting at that lower wavelength to enhance the reflectivity at that lower wavelength.

29 Claims, 13 Drawing Sheets

U.S. PATENT DOCUMENTS

| | | | |
|---|---|---|---|
| 4,885,753 A | | 12/1989 | Okai et al. |
| 5,007,062 A | * | 4/1991 | Chesnoy .................... 372/26 |
| 5,088,097 A | * | 2/1992 | Ono et al. .................... 372/20 |
| 5,119,393 A | * | 6/1992 | Oka et al. ................ 372/50.22 |
| 5,379,318 A | * | 1/1995 | Weber .......................... 372/96 |
| 5,748,660 A | * | 5/1998 | Delorme et al. ......... 372/50.11 |
| 5,838,714 A | | 11/1998 | Delorme |
| 6,104,739 A | * | 8/2000 | Hong et al. .............. 372/50.11 |
| 6,445,724 B1 | * | 9/2002 | Abeles ................. 372/50.124 |
| 6,614,817 B1 | * | 9/2003 | Nomura et al. ............... 372/18 |
| 6,690,688 B1 | * | 2/2004 | Gotoda ........................ 372/20 |
| 2003/0169792 A1 | * | 9/2003 | Kim ............................. 372/45 |

FOREIGN PATENT DOCUMENTS

| | | |
|---|---|---|
| EP | 0847116 A2 | 1/2002 |
| EP | 0847116 A3 | 1/2002 |

OTHER PUBLICATIONS

Kim, B-S. "Time-domain large-signal analysis of widely tunable DBR laser diodes with periodically sampled and chirped gratings." *IEEE Photonics Technology Letters* 10(1):39-41 (1998).

Talneau, A. et al. "Multiwavelength grating reflectors for widely tunable laser." *IEEE Photonics Technology Letters* 8(4):497-499 (1996).

* cited by examiner

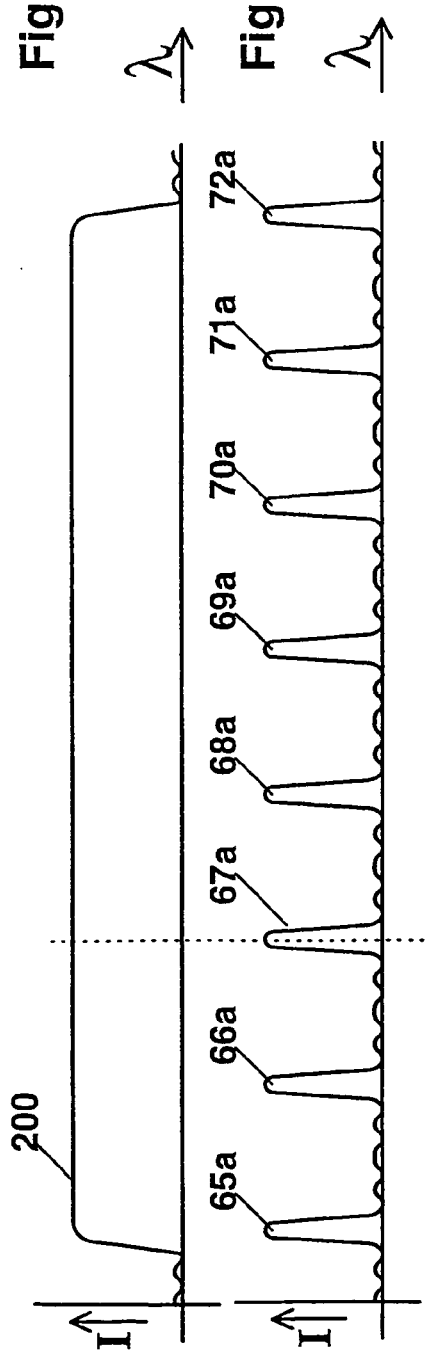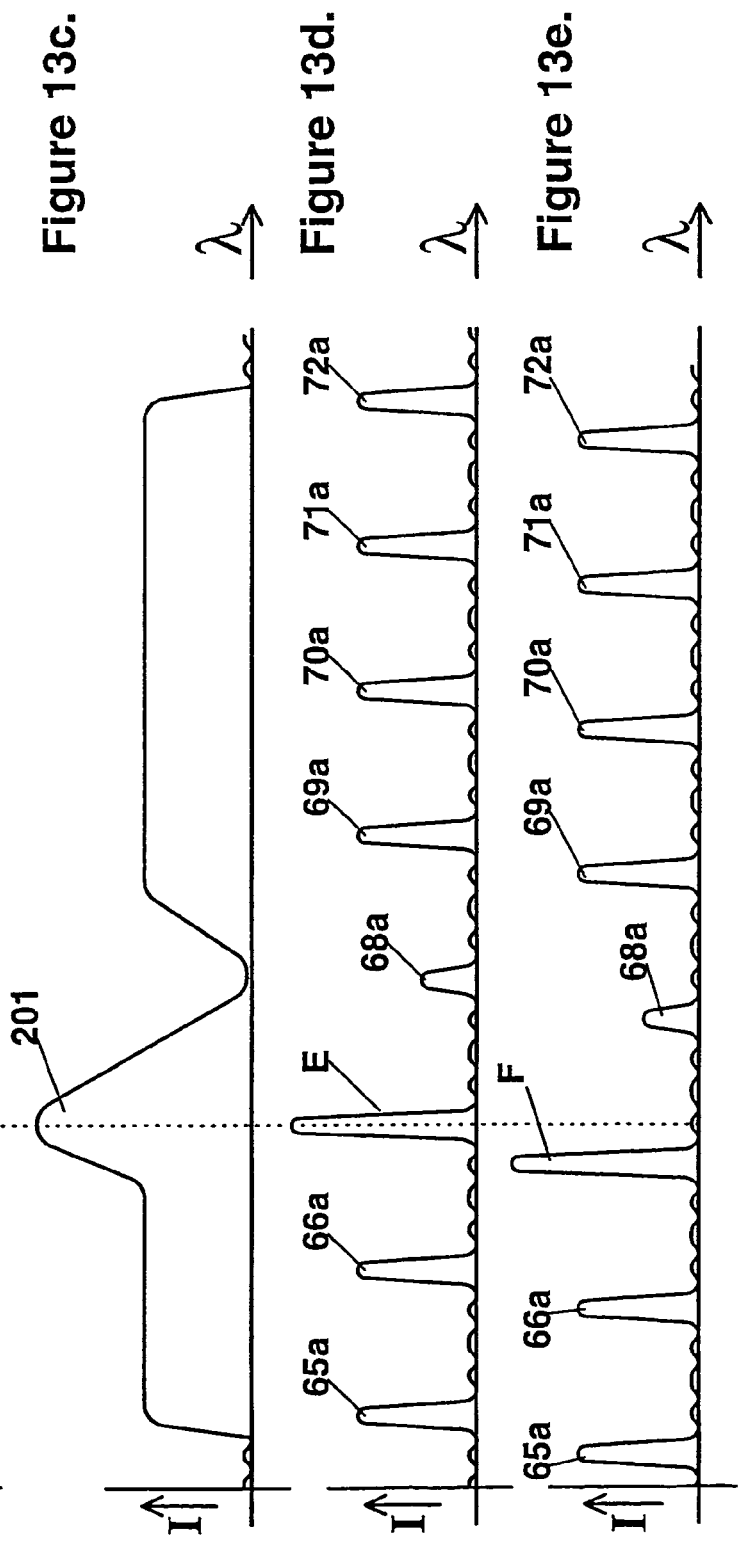

TUNEABLE LASER

RELATED APPLICATIONS

This application is a 35 U.S.C. 371 national stage filing of International Application No. PCT/GB02/03463, filed 29 Jul. 2002, which claims priority to Great Britain Patent Application No. 0118412.6 filed on 30 Jul. 2001, and Great Britain Patent Application No. 0124921.8 filed 17 Oct. 2001, in Great Britain. The contents of the aforementioned applications are hereby incorporated by reference.

This invention relates to tuneable lasers and has particular, but not necessarily exclusive, reference to tuneable lasers for use in telecommunications systems operating in the C-band, namely within the band of 1530 to 1570 nm. The embodiments concern in particular, but not exclusively, four section distributed Bragg reflector tuneable lasers.

BACKGROUND OF THE INVENTION

In this specification the term "light" will be used in the sense that it is used in optical systems to mean not just visible light but also electromagnetic radiation having a wavelength between 1000 nanometres (nm) and 3000 nm.

Single wavelength lasers are important for a number of applications in optical telecommunications and signal processing applications. These include multiple channel optical telecommunications networks using wavelength division multiplexing (WDM). Such networks can provide advanced features, such as wavelength routing, wavelength conversion, adding and dropping of channels and wavelength manipulation in much the same way as in time slot manipulation in time division multiplexed systems. Many of these systems operate in the C-band in the range 1530 to 1570 nm.

Tuneable lasers for use in such optical communications systems, particularly in connection with the WDM telecommunication systems, are known. A known tuneable system comprises stacks of single wavelength distributed Bragg reflectors (DBR) lasers, which can be individually selected, or tuned over a narrow range, or by a wide tuning range tuneable laser that can be electronically driven to provide the wavelength required. Limited tuning range tuneable lasers that rely upon thermal effects for tuning are also known.

U.S. Pat. No. 4,896,325 discloses a wavelength tuneable laser having sampled gratings at the front and rear of its gain region. The laser described in that specification relies on the use of two different gratings which produce slightly different reflection combs in the front and rear gratings. These provide feedback into the device. The gratings can be current tuned in wavelength with respect to each other. Co-incidence of a maximum from each of the front and rear gratings is referred to as a supermode. To switch the device between supermodes requires a small incremental electrical current into one of the gratings to cause a different pair of maxima to coincide in the manner of a vernier. By applying electrical currents to the two gratings so that the corresponding maxima track, continuous tuning within a supermode can be achieved.

In summary, for a given set of drive currents in the front and rear grating sections, there can only be a simultaneous correspondence in reflection peak at one wavelength, as a consequence of which the device lases at that wavelength. To change that wavelength a different current is applied to the front and rear gratings. Thus the front and rear gratings operate in a vernier mode, in which the wavelengths of correspondence determine a supermode wavelength.

An improved form of selective grating is the phase shifted grating, as described in UK-A-2 337 135, the contents of which are incorporated herein by way of reference.

The term "phase shifted grating" as used herein is used to describe and define a selectively reflecting distributed Bragg grating which is constructed and operates in the manner described and claimed in UK-A-2 337 135. In other words, a phase shifted grating is one in which the grating structure comprises a plurality of repeat gratings in which each grating unit comprises a series of adjacent diffraction gratings having the same pitch, and is characterised in that the grating units and adjacent gratings within a grating unit are separated by a phase shift of substantially pi ($\pi$) radians and in which at least two of the gratings within a grating unit have different lengths, the lengths being selected so as to provide a predetermined reflection spectrum.

Details on the construction and operation of the phase shifted-grating are to be found in UK-A-2 337 135. The Bragg gratings may be defined using e-beam writing onto suitable photoresist as a processing step.

SUMMARY OF THE INVENTION

By the present invention there is provided a tuneable laser having a gain section bounded at one end by a first reflector in the form of a distributed Bragg reflector adapted to produce a comb of reflective peaks and on the other end by a second Bragg reflector, the second Bragg reflector adapted to reflect at a plurality of wavelengths and being capable of being varied selectively through discrete segments so that one or more segments of the Bragg reflector can be tuned to a lower wavelength to reflect with a segment reflecting at that lower wavelength to enhance the reflectivity at that lower wavelength.

The lower wavelength to which the second reflector is tuned may substantially coincide with a peak of the first reflector.

The second reflector may be formed in a material having a variable refractive index and the variation of the reflected wavelength may be affected by varying the refractive index of the material.

The refractive index may be varied by passing an electrical current via electrodes through the material in which the second reflector is formed.

The second Bragg reflector may be a chirped grating and may be formed in a material having a refractive index variable in response to the passage of current therethrough, there may be a plurality of external electrodes along the length of the grating, with each electrode being selectively connectable to a power source.

The second Bragg reflector may comprise a plurality of discrete grating segments, at least two of which grating segments may have a different pitch wherein current may be applicable to at least the grating having a longer pitch such that the effective wavelength of the grating having a longer pitch can be tuned to the wavelength of the grating having a shorter pitch.

The chirped Bragg reflector may comprise a linear chirp of progressive pitch variation along the chirp with the shortest pitch closest to the gain section.

The second Bragg reflector may comprise a plurality of discrete grating segments, each grating segment having a different pitch, such that the grating segment closest to the gain section has the shortest pitch, the pitch of each successive grating segment from the gain section may be greater than the pitch of the preceding segment.

Each grating segment may have an independently actuable electrode.

A switching circuit may be provided to switch the current to the electrodes.

The tuneable laser may be manufactured using semiconductor materials, particularly using a III-V semiconductor material. It may be manufactured using electron beam writing techniques or may be manufactured using a holographic phase grating plate.

The Bragg segments in the second reflector may be each kept short so that the cumulative waveguide length associated with the Bragg gratings is minimised, thereby keeping the waveguide attenuation losses low.

The distributed Bragg reflector forming the first reflector may be a phase shifted Bragg grating reflector, and light may be emitted through the second reflector.

There may be a phase change section between the gain section and either one or both of the reflectors.

The phase change section may be located between the gain section and the first reflector.

Alternative arrangements of the segmented grating order are possible within the scope of the invention.

Alternative arrangements of the chirp are possible for example, a non linear progressive chirp, and the longest pitch being closest to the gain section.

In the case where the second reflector is a chirped Bragg reflector it may be considered as being partitioned into chirp segments each consisting of part of the over all chirp grating, all chirp segments being concatenated.

Other means of varying the refractive index than a current could be used, for example by thermal means, or use of an electric field.

By short Bragg segments is meant lengths such that the associated reflectivity of each segment is broad and there is a degree of overlap between neighbouring segment reflectivities. However, the segment reflectivity discrimination is sufficient for stable lasing operation in combination with reduced light power losses.

In one embodiment the first reflector comprising a distributed Bragg reflector which is made long as herein defined.

"Long" as used in this context herein means as many repeat grating units, as described in UK-A-2 337 135, as are required to produce sufficiently narrow peaks for single longitudinal mode operation of the laser. Preferably 10 or more repeat grating units are present.

The first reflector may also have an electrode to permit electrical current to be passed through it to alter the wavelengths at which the comb of reflecting peaks reflects.

The phase change section(s) may have an electrode(s) to permit the passage of electrical current through the phase change section(s) to alter the refractive index of the material of the phase change section(s) to affect the phase change.

The refractive index of the material in which the front and rear Bragg gratings are formed is variable simultaneously to affect fine tuning of the laser.

The distances between the electrodes on the second reflector are short as herein defined.

The grating of the first reflector may be long so as to produce reflection peaks at well defined wavelengths.

BRIEF DESCRIPTION OF THE DRAWINGS

FIGS. 13a to 13e are graphs of intensity I vs. wavelength $\lambda$, for the chirp Bragg second reflector embodiment.

DESCRIPTION OF THE PREFERRED EMBODIMENTS OF THE INVENTION

The wavelengths of interest referred to above, for example the C-band wavelengths of 1530 to 1570 nm are the wavelengths of light in free space. When such light passes through a medium, of refractive index $n_{eff}$ the actual wavelength of the light within that medium, which will be referred to herein as $\lambda'$, is the wavelength $\lambda$ divided by the value for the refractive index $N_{eff}$. In other words $$\lambda' = N_{eff} \quad (1)$$

where $N_{eff}$ is the effective refractive index of the medium as seen by the propagating light of wavelength $\lambda$ in free space.

It so happens that the glass (silica) fibres, which are commonly used in telecommunications systems, have low loss regions at about 1100 nm, 1300 nm and 1500 nm. These regions are about 100 nm wide and consequently much work is done on producing lasers that produce light in the low loss bandwidths. The same is true for the tuneable laser of the present invention. The specific examples of the invention are designed to work in the c-Band, but the invention could be used for other wavelengths if required and if new types of fibre optical cables become available.

Figure 1:
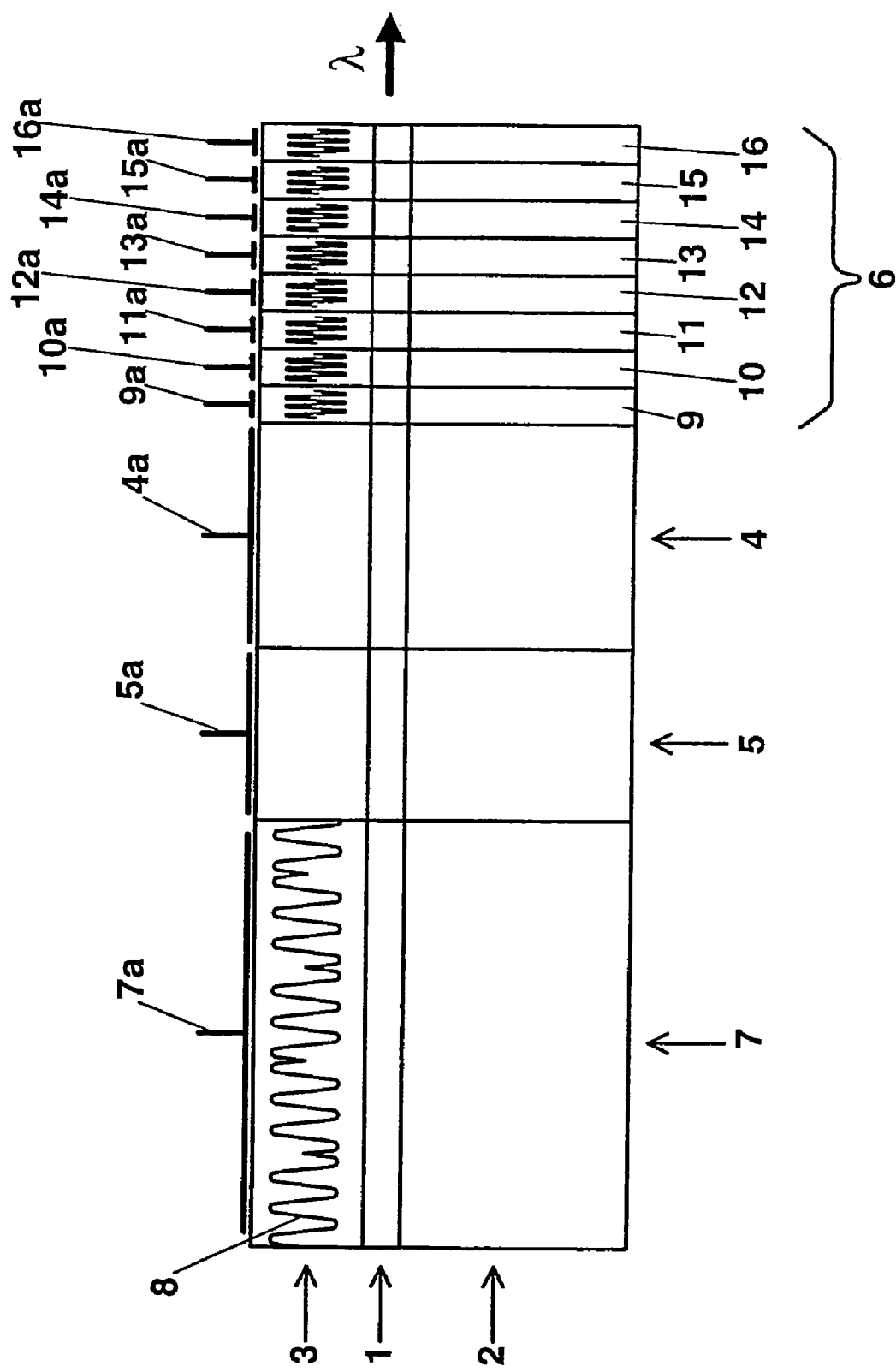
FIG. 1 is a schematic cross section through a laser in accordance with the invention incorporating a segmented Bragg second reflector.
Figure 3:
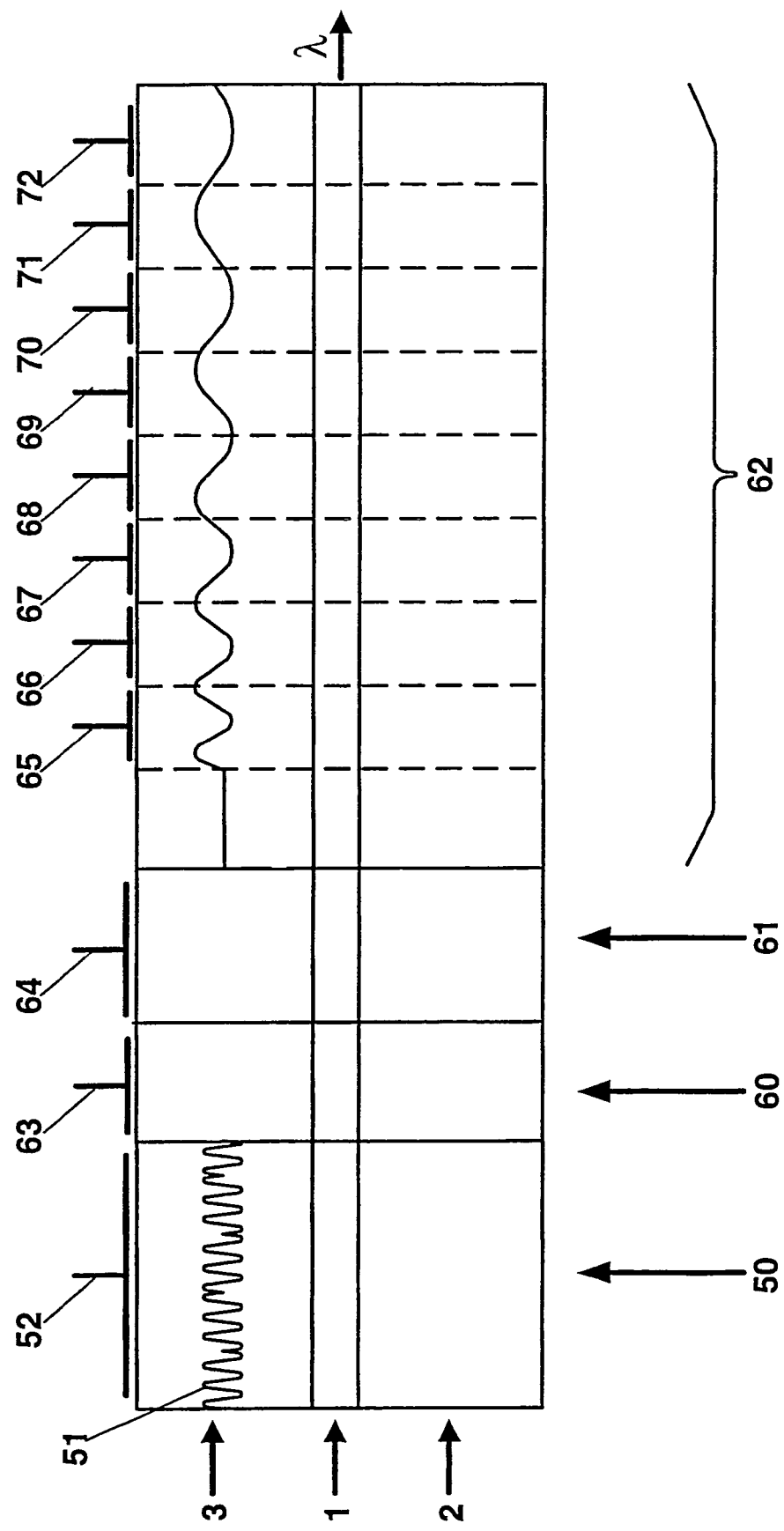
FIG. 3 is a schematic cross section through a laser in accordance with the invention incorporating a chirped Bragg second reflector.
Figure 4:
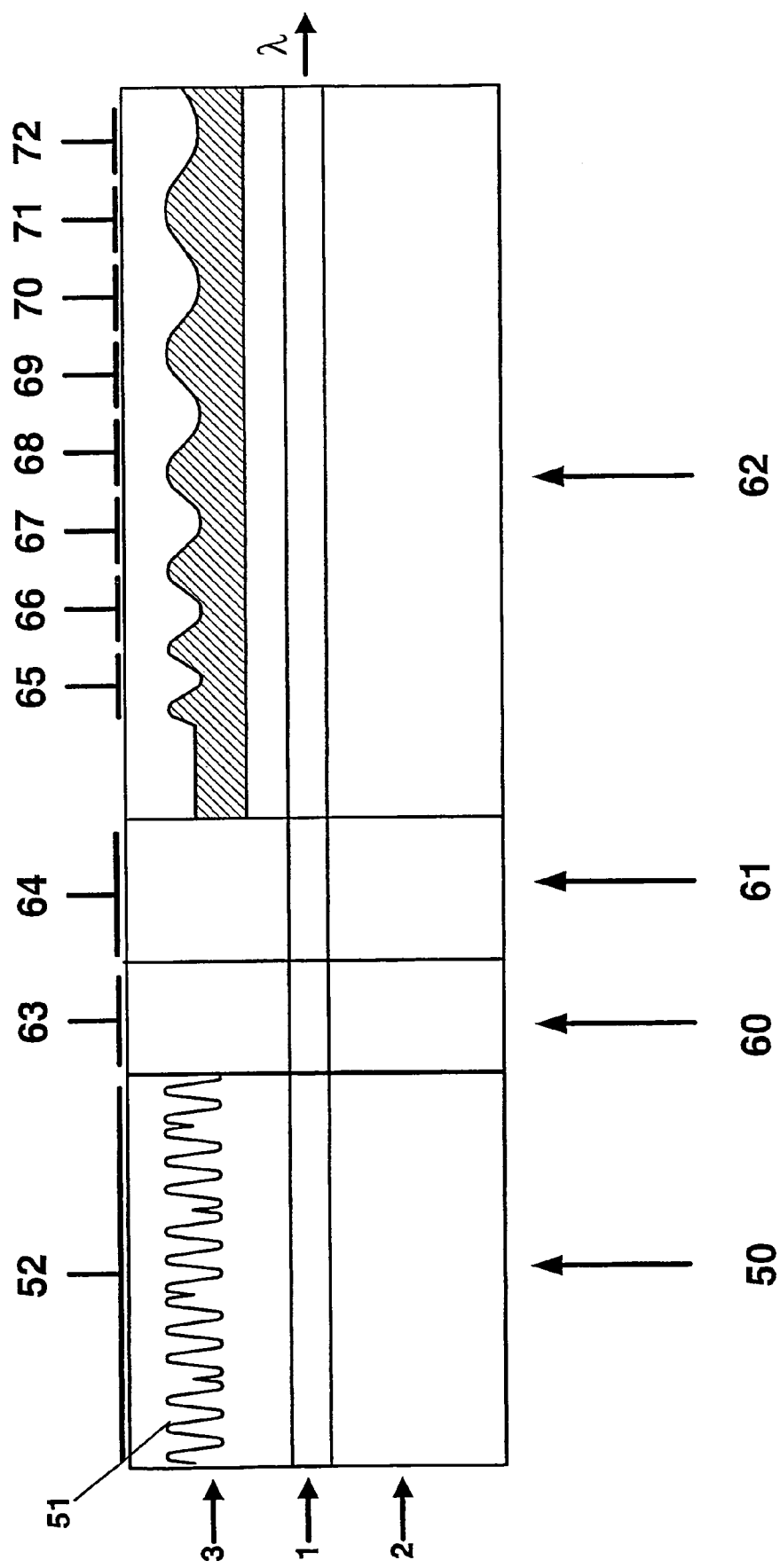
FIG. 4 shows a second embodiment of the invention.

Referring to FIGS. 1 and 3, they show schematic cross sectional views of a lasers in accordance with the present invention. As is conventional in semiconducting lasers the laser is built up in a series of layers, with a layer 1 formed between a lower layer 2 and an upper layer 3. Layer 1 bounded by layers 2 and 3 forms a waveguide. There may be a plurality of layers in the structure, but they are not material to the invention and for the better understanding of the invention they are not shown.

In FIG. 1 the laser itself has four principal sections. Again section 4, a phase change section 5 and front and rear reflecting sections 6 and 7. The rear reflecting section 7 has a phase shifted grating distributed Bragg reflector 8 formed in the layer 3. Such a reflector produces comb of reflectance peaks at separated wavelengths, and each peak is of substantially the same height. The front reflector 6 is made up of a series of segments, each segment being a distributed Bragg reflector, each segment centred at substantially a single wavelength with a broad wavelength reflecting spectrum. The centre wavelengths of the individual peaks of the segments 9 to 16 correspond to the peaks of the comb of reflectance produced by the front reflector distributed Bragg reflector.

In FIG. 3 the laser itself has four principal sections. A gain section 61, a phase change section 60 and front and rear reflecting sections 62 and 50 respectively. The rear reflecting section 50 has a phase shifted grating distributed Bragg reflector 51 formed in the layer 3. Such a reflector produces a comb of reflectance peaks at separated wavelengths, and each peak is of substantially the same height. The front reflector section 62 consists of a linear chirped grating of progressive pitch variation along the length. Above the chirped grating are a series of individual adjacent electrodes 65 through 72, that define sub-region chirped gratings that together comprise the over-all chirped grating. Each of the sub-region chirped gratings reflects over a range of wavelengths. In its passive state the total reflection spectrum covers the band of interest with substantially uniform reflectivity.

The invention design may be suitably applied to solid-state lasers manufactured using Group III-V or other semiconductor materials.

Figure 2:
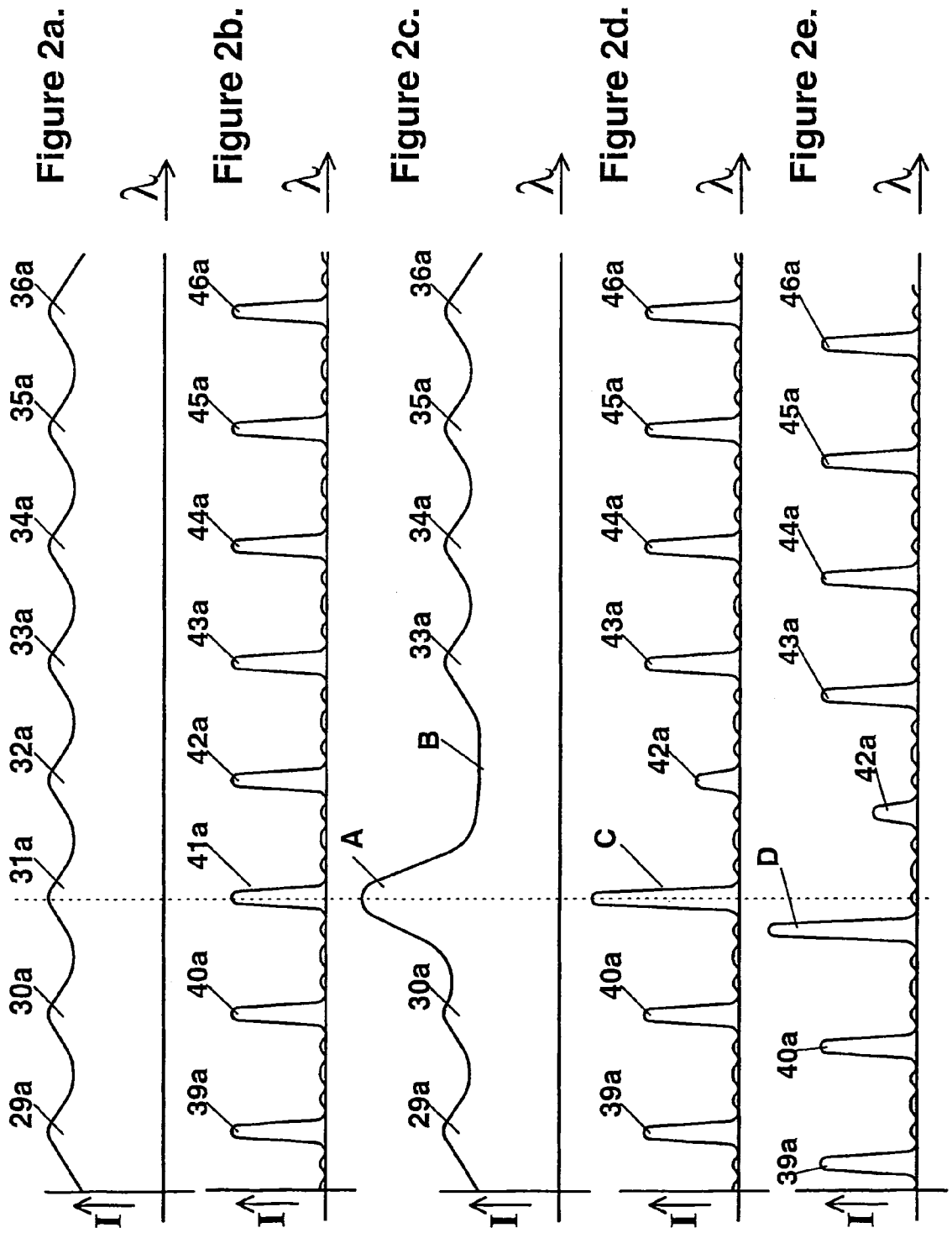
FIGS. 2a to 2e are graphs of intensity I vs. wavelength $\lambda$, for the segmented Bragg second reflector embodiment.

In the case of the segmented Bragg grating front reflector four section laser, the method of operation of the laser is more readily understood by reference to FIGS. 2a to 2e. These drawings show aligned one above the other the combs of reflectance produced by the front and rear reflectors. In the drawings the intensity of reflectance I is plotted vertically against wavelength $\lambda$. FIG. 2a shows the comb of reflectances 29a to 36a produced by the segmented gratings 9 to 16 when no current is applied to any of the electrodes 9a to 16a. The comb peaks are broad due to the Bragg grating segments being short. This comb is positioned directly over the comb of reflectances 39a, to 46a shown in FIG. 2b, which is produced by the rear grating 8 in the laser. It can be seen that the peaks 29a to 36a substantially coincide in wavelength with the wavelengths of peaks 39a to 46a.

If just sufficient current is injected into the gain section to make it generate light, the laser will not lase because the intensity of the light at all of the wavelengths represented by the peaks 29a to 36a (and of course all other wavelengths) is below the lasing threshold.

To get the laser to lase predictably, it is necessary to have both a population inversion of charge carriers within the gain material and to get at least one, and preferably only one, wavelength to be above the lasing threshold. This is achieved by injecting sufficient current into the gain section 4 through electrode 4a to create the population inversion and by making a portion of the front grating reflect light of a specific wavelength preferentially, so that the rear grating selectively reflects light of that particular wavelength. The front grating will reflect back the light of that wavelength, so that that wavelength will become the preferred or enhanced wavelength and the laser will commence to lase at that wavelength.

This is carried out as follows.

The material of which layer 3 is formed in the sections corresponding to the reflectors 6 and 7 is such as to experience a reduction in refractive index when an electrical current is passed through it. Thus if a current is passed through the electrode 12a, the wavelength at which the Bragg reflector in segment 12 reflects light will be reduced. If the reduction is such that it now reflects light at the same wavelength as the Bragg reflector of the adjacent segment, segment 11, then the arrangement shown in FIG. 2c will occur. The intensity of the peak 31a as shown in FIG. 2a is reinforced such that it is much higher as shown at A in FIG. 2c and more intense than the peaks 29a 30a, and 33a to 36a. As a consequence, peaks 32a of FIG. 2a is reduced as shown at B in FIG. 2c.

Now if current is also passed through the electrode 4a to create light in the gain section 4 at an intensity above the lasing threshold, the light at wavelength corresponding to the peaks 31a and 41a is selectively reinforced and the laser will commence to lase at that wavelength as shown at C in FIG. 2d. Thus the laser will be tuned to that wavelength. An advantage of this laser design is that the breadth of the front reflector peak can be sufficiently broad that tuning may be affected solely by the rear grating tuning current, within the wavelength window defined by the broad front reflector peaks.

If a current is then also passed through electrode 7a this will effectively move the whole comb of peaks 39a to 46a including peak D to lower wavelengths as shown in FIG. 2e. The peak D will have a slightly reduced intensity compared to peak C because the maxima of the peaks of the front and rear reflectors are no longer exactly aligned.

If at the same time a current is passed through electrode 11a and the current passing through electrode 12a is increased, then the peak 31a in FIG. 2a will also move to a lower wavelength and thus the maxima of the peaks of the front and rear reflectors can be brought back into exact alignment.

Thus the laser can be fine tuned to lase at wavelengths between the peaks 39a to 45a as shown in FIG. 2b by either of the two operations.

It will be appreciated that as the peak 35a cannot be moved to longer wavelengths by this method, the longest wavelength at which the laser can lase is substantially that of peak 45a as shown in FIG. 2d.

To ensure complete band coverage out of band, or edge-of-band, segments can be employed. The long wavelength out-of-band segment being provided with a tuning electrode so that it can, by means of current injection, be driven to coincide with the first in-band long wavelength segment. The short wavelength out-of-band segment does not of necessity need to be provided with an electrode as its operation, as this lasing wavelength, is determined by driving current into the shortest wavelength in-band segment. The short wavelength out-of-band segment does need to be provided with an electrode if required to be fine tuned.

Incorporation of these out-of-band, or edge-of-band segments allows for production spread in operating characteristics and helps improve production yields.

With InP, as a typical Group III-V laser material the reduction in material refractive index through current injection permits wavelength tuning, in the range of 1–10 nm. Using such material the tuning segments will typically be designed at 4 nm wavelength spacing. With such an arrangement to produce coincidence with its next lowest wavelength neighbour requires 4 nm wavelength shift of a segment, whilst leaving a further 4 nm coincident tuning capability. By this means the whole band of interest may be covered.

In the case of the chirped grating distributed Bragg front reflector the method of operation of the chirp section is more readily understood by reference to FIGS. 3 to 12.

Referring to FIG. 3 this shows an alternative form of the invention in which the discrete Bragg grating sections 9 to 16 of FIG. 1 are replaced with a chirp grating. The laser assembly includes a rear reflecting section 50 similar to rear reflecting section 7 of FIG. 1 and having a phase shifted Bragg grating 51, a gain section 61a phase change section 60 and a chirp grating section 62. Located on the gain section 61 is an electrode 64 to enable the passage of current into the gain section. Located on the rear reflecting section 50 is an electrode 52 and on the phase change section 60 is an electrode 63 to enable the passage of current into the rear reflector and phase change sections respectively. Located on the chirp Bragg section is a series of individually selectable electrodes 65 to 72 to permit current to be passed selectively into portions of the chirp grating within section 62.

The chirp grating is a form of Bragg grating which has a substantially continuous variation in the wavelength at which it reflects light along its length. It is thus distinguished from a normal distributed Bragg reflector (DBR) which reflects at a single peak wavelength and also from a sampled grating DBR, which reflects at a plurality of discrete wavelengths.

A chirp grating is formed at the interface between two materials of different refractive index and can be represented graphically as a sinusoidal shaped waveform, or as a castellated form. The physical shape of the grating is dependant upon the etching technique employed and may result in a castellated form, particularly when a dry etching process is used to produce the grating, e.g. reactive ion etching.

The refractive index, n, of the material used in the production of the chirp grating through which the majority of the light passes is a quaternary material (InGaAsP) and the refractive index of the material varies with the wavelength of light passing through the material. Typically n at 1570 nm is 3.33, at 1550 nm n is 3.38 and at 1530 nm n is 3.43. Thus n decreases by about 3% from 1530 nm to 1570 nm.

An explanation of the construction and operation of the chirp grating is provided by FIGS. 4 to 12.

Figure 5:
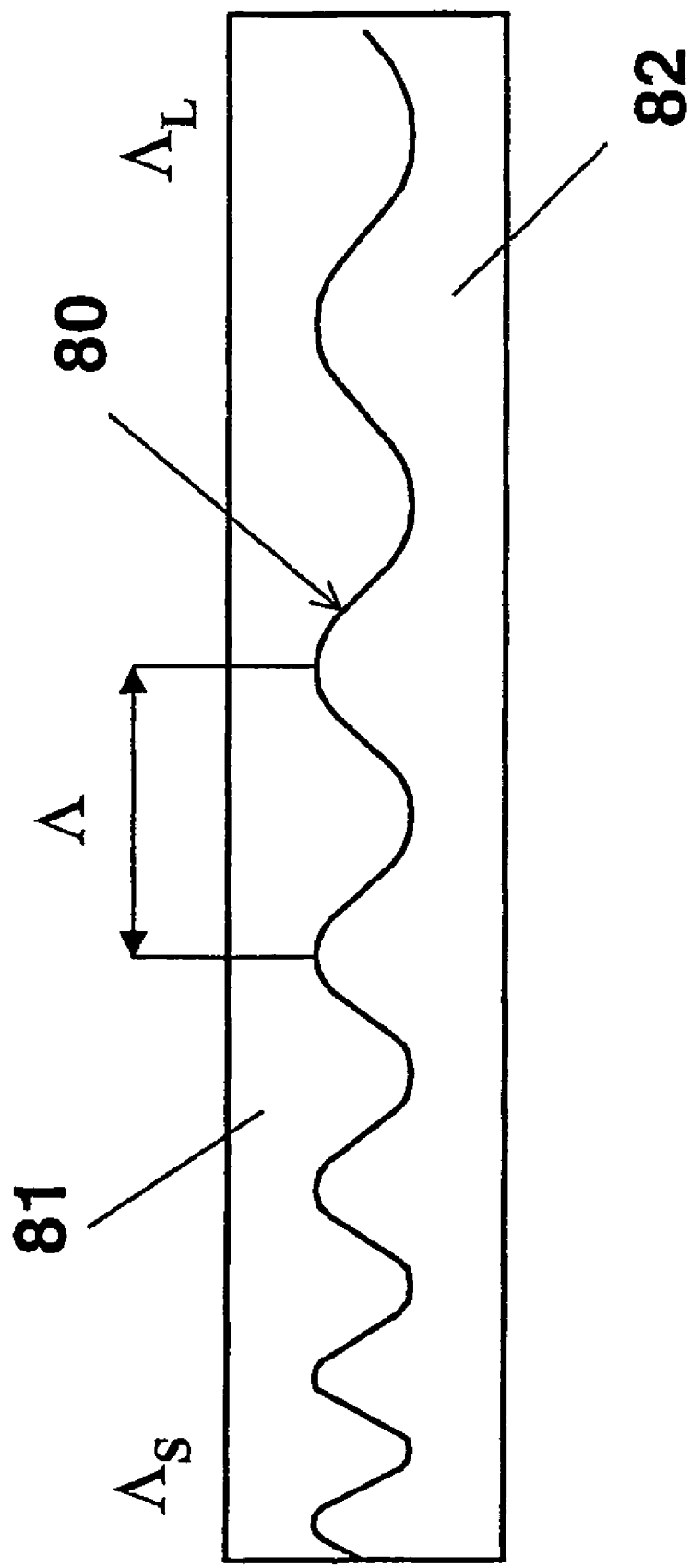
FIG. 5 shows a chirp grating.

As shown in FIG. 5 the grating is fonIIed as an interface 80 between the upper layer of material 81 of a low refractive index and a lower layer 82 of a higher refractive index. This interface can be represented as a waveform and the pitch $\Lambda$ of the waveform making up the grating is gradually increased along the length of the grating from As at the short end of the chirp grating to $\Lambda_L$ at the long end of the grating. In FIG. 5 the increase in pitch is deliberately exaggerated to demonstrate what is happening. In practise the increase in pitch length over the whole of the grating is small, namely about 2.5%, so that at the short end the grating reflects light of a wavelength of about 1530 nm and at the long end the grating reflects light at a wavelength of 1570 nm. Thus there is a 40 nm variation in the reflection wavelength over the length of the grating, which is about 2.5% of the average wavelength of 1550 nm.

Figure 6:
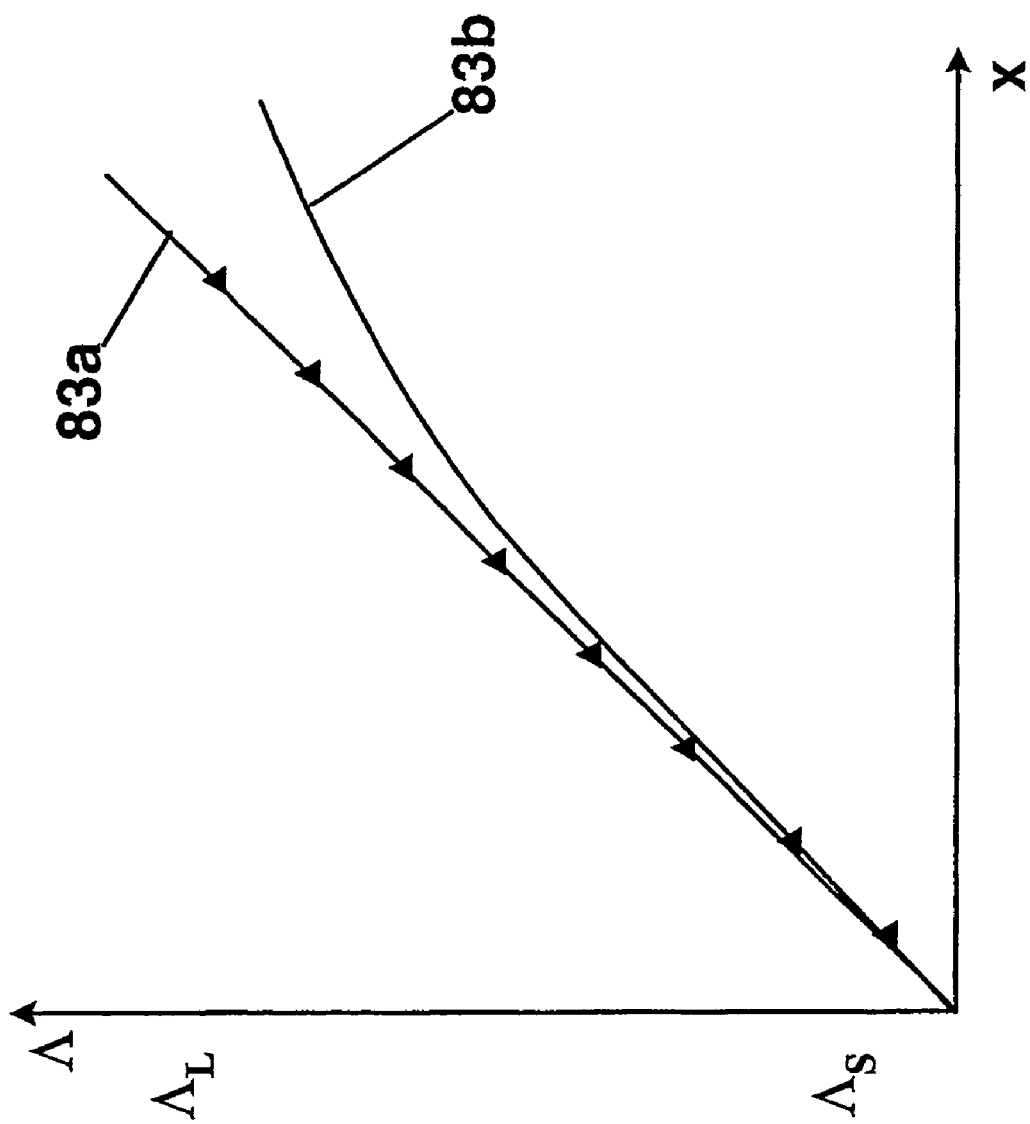
FIG. 6 shows a chirp line.

In FIG. 6, there is a graph showing how the pitch of the grating varies along its length with the pitch $\Lambda$ in the vertical axis and the length of the grating x on the horizontal axis.

It will be appreciated that the pitch values, $\Lambda$, along the length of the grating can be plotted directly against the length and a line is generated. The line can be straight or can be curveg depending on how the pitch length is varied along the length of the grating. If the increase in grating pitch is at a constant rate the line is straight as shown at 83a, and the grating is called a linear chirp grating. If the increase in grating pitch along the grating is unifonI1, in other words in the direction of increasing $\Lambda$, each $\Lambda$ is a certain small constant step increment on the one before it, then the line will not be linear but will curve downwards as shown at 83b, as the line increasingly goes to the right. Other increases in grating pitch along the grating will produce different curves.

Figure 7:
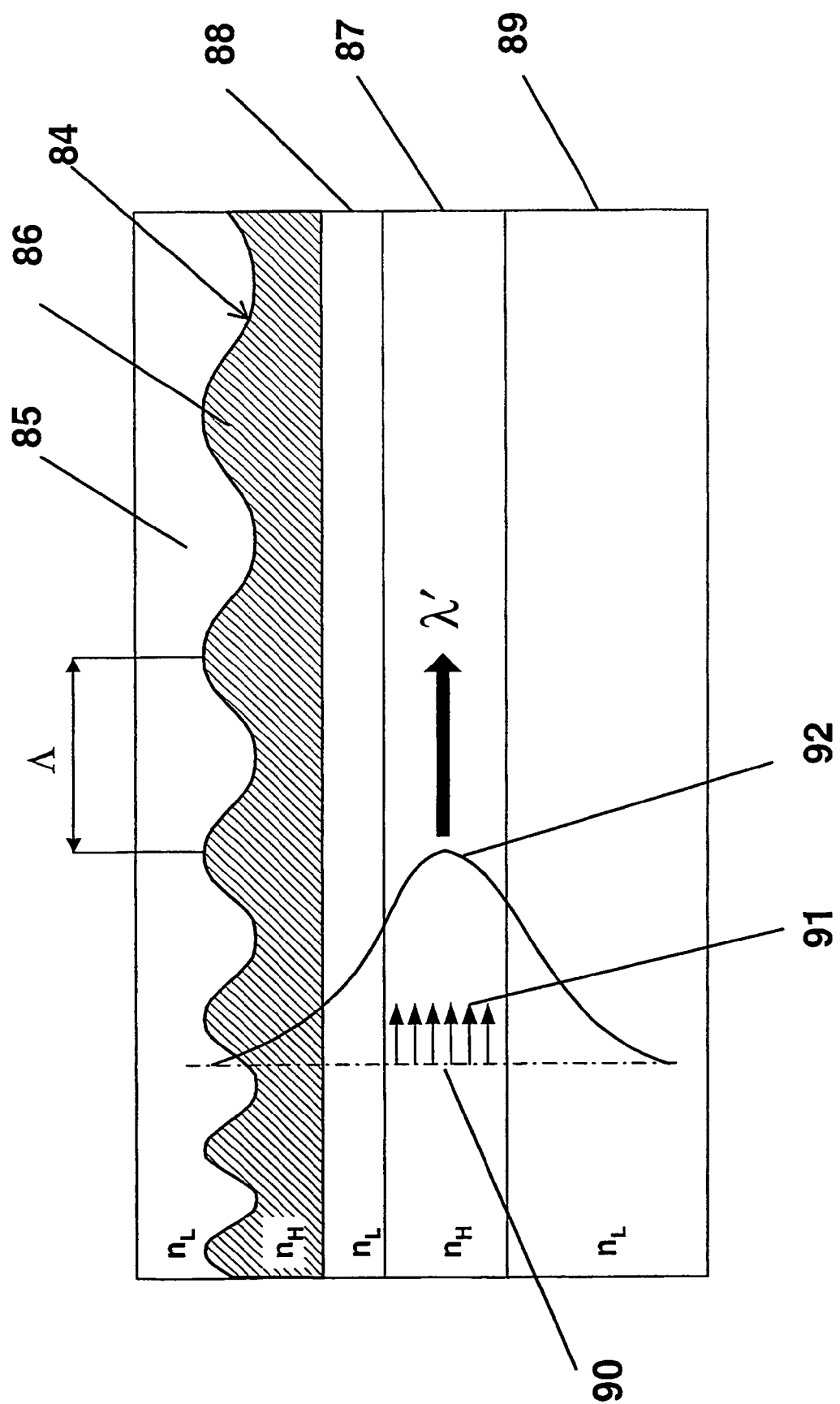
FIG. 7 shows an enlarged view of light passing down a chirp grating.

Referring to FIG. 7, this demonstrates the effect of light passing along a chirp grating. Again the grating is shown as a sinusoidal interface 84 between an upper layer 85 of a lower refractive index and a lower layer 86 of higher refractive index. The waveguide of the assembly of high refractive index through which the majority of the light passes is shown at 87, separated from the lower layer 86 of the chirp grating by an intermediate layer 88 of low refractive index. Underneath the waveguide 87 is a further low refractive index substrate 89. Superimposed on the layer structure is a graphical representation of the wavefront of the light passing through from left to right as at 90 in the direction of the arrows 91. Line 92 is an indication of the intensity of the light in the layers of the assembly and it can be seen that most of the light passes through in the waveguide of high refractive index.

As shown in FIG. 7, the light passes not only through the waveguide but the evanescent wave also passes along the layer 86 forming the lower layer of the chirp grating. If the light should happen to have a wavelength $\lambda'$ which is twice the length of a pitch $\Lambda$ then that light will be reflected back i.e. if $\Lambda'=2\Lambda$ then that wavelength of light will be reflected. Thus the chirp grating as a whole will reflect light in the range $\lambda'_s=2\Lambda_s$ to $\lambda'_L=2\Lambda_L$ where $\Lambda_s$ is the shortest grating pitch and $\Lambda_L$ is the longest grating pitch. Light of wavelengths outside of this range will not be reflected back along the waveguide.

Figure 8:
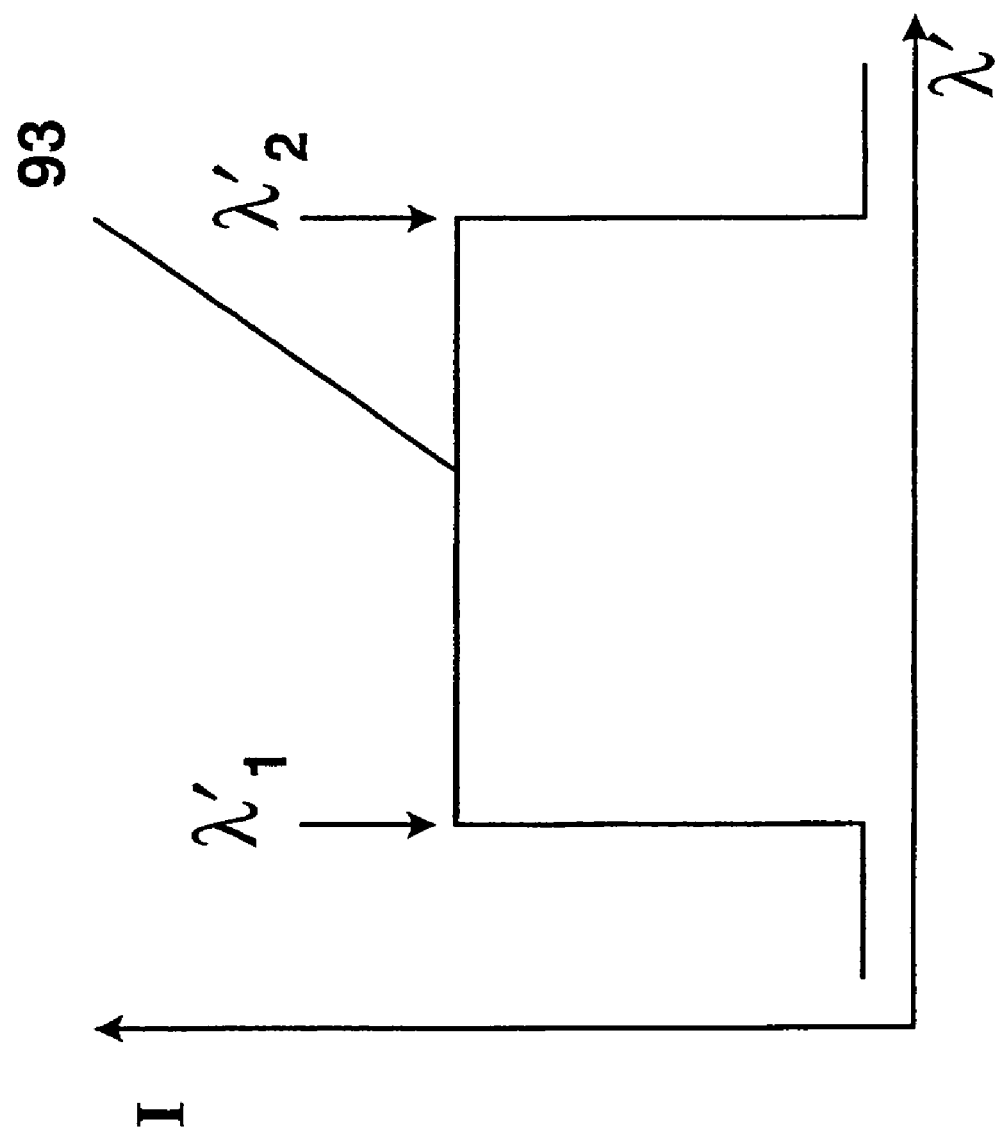
FIGS. 8 and 9 show box diagrams of light intensity vs wavelength.
Figure 9:
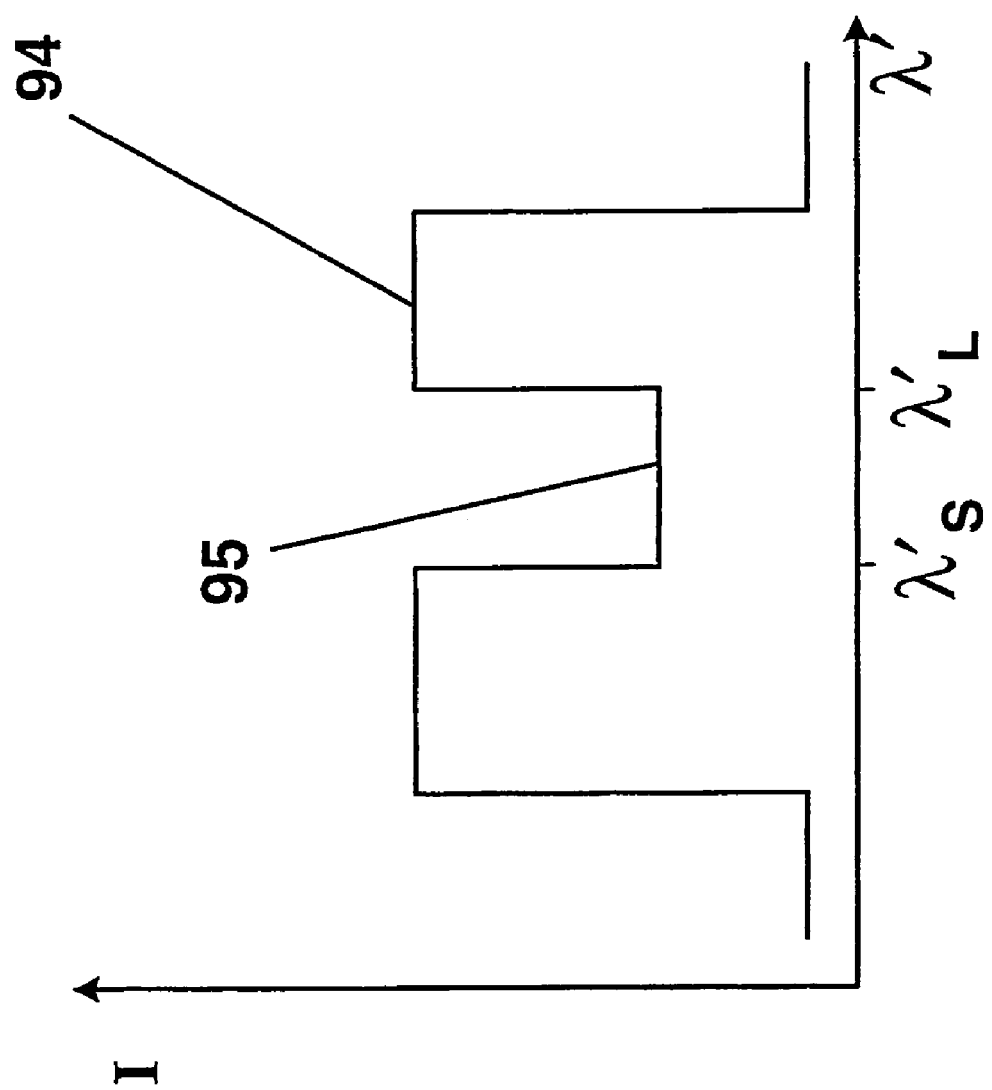

This can be represented diagrammatically as in FIGS. 8 and 9, which are box diagrams of intensity of light I in the vertical axis and wavelength $\lambda'$ in the horizontal axis. If a box of light of plurality of wavelengths is admitted into the grating as shown at 93 in FIG. 8, the envelope is complete and represents all of the wavelengths between $\lambda'1$ and $\lambda'2$ which are widely separated wavelengths. However as the chirp grating reflects certain of the wavelengths, for example between $\lambda'_s$ and $\lambda'_L$ in FIG. 5, the emerging box of wavelengths 94 as shown in FIG. 9 has a gap 95 which corresponds to those wavelengths between $\lambda'_s$ and $\lambda'_L$ reflected by the chirp grating.

The chirp grating will, if in its complete and unaltered condition, reflect all wavelengths between $\lambda'_s$ and $\lambda'_L$ without any preference. However if one of the electrodes such as electrode 68 of FIG. 10, has a current passed through it, then that will lower the refractive index of the material in which the chirp grating is created. This will result in the grating as a whole being selectively enhanced in its reflectivity at an adjacent lower wavelength specific wavelength and this can result in the laser lasing at that wavelength.

This will be explained below in greater detail with reference to FIG. 10. In this figure the upper portion shows the laser of FIG. 4. This is positioned over the chirp diagram (as shown in FIG. 6) which in turn is positioned over a drawing of the reflectivity of the chirp grating vs distance.

Figure 10:
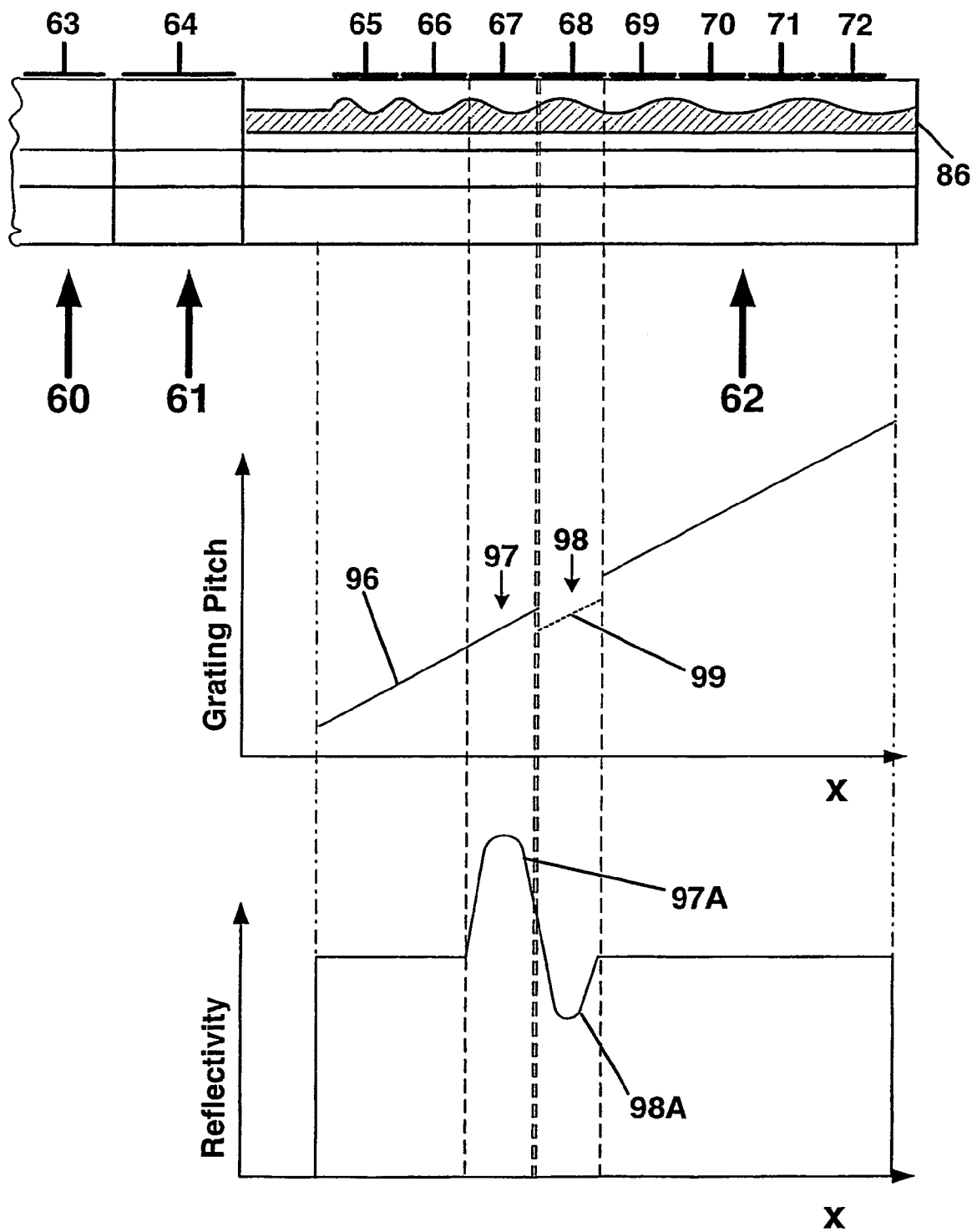
FIG. 10 is an explanatory view of a chirp laser chirp line and light intensity.

It can be seen in the central portion of FIG. 10, where the grating pitch A is plotted against distance x, that the chirp response line is shown by a line 96. It will be seen that line 96 has a region 98, shown dotted below the main portion of the line, for reasons which will be explained below.

On the outer surface of the laser there are a series of electrodes 63 to 72. The electrode 64 can be used to inject current into the gain section to make it create light. The electrode 63 can be used to control the phase section as described below and the electrodes 65 to 72 are able to inject current into different regions of the grating 62.

If just sufficient current is injected into the gain section to make it generate light, then if the chirp section is capable of reflecting light in the range of 1530 to 1570 nm the wavelengths of light within that range will be internally reflected. Light outside of the reflecting wavelengths will be absorbed or will be emitted from the ends of the laser. The laser will not lase because the intensity of the light at all of the frequencies in the range 1530 to 1570 nm is below the lasing threshold.

The selection of a particular wavelength at which the chirp grating will reflect is affected by passing a current through an electrode such as electrode 68 above the portion of the chirp grating which corresponds to the region 98 in the chirp curve 96. The effect of the passage of current is to increase the current density in that region of the grating, which lowers the refractive index of the grating layer 86 just below the electrode 68. The lowering of the refractive index has the effect of making the grating reflect at a lower wavelength, which is the same effect as would be obtained by shortening the grating pitches in that region.

This means that the effective grating pitches of the dotted portion 99 as is shown in the central portion of FIG. 10 now line up with the adjacent region 97, forming a chirped Fabry-Perot étalon, which thus reinforces the reflection in the adjacent region 97.

Referring to the lowest portion of FIG. 10, which is a graph of reflectivity 11 vs. distance x, it can be seen that there is a trough 98A in the reflectivity of the grating which corresponds to the region 98 that now reflects at a lower wavelength. However there is now an enhancement of the reflectivity of the region 97 due to the resonant chirped Fabry-Perot étalon structure. Thus there is produced the reinforced peak 97A in the reflectivity.

Light at the wavelength that corresponds to the position of peak 97A is thus selectively reflected.

It will be appreciated that without any further adjustments, the reflection characteristics of the chirp grating could only be adjusted to as many different wavelengths as there are electrodes 65 to 72.

However, the grating can be made continuously adjustable if it is assumed that the materials from which the chirp gratings are constructed have a sufficiently variable refractive index.

Figure 11:
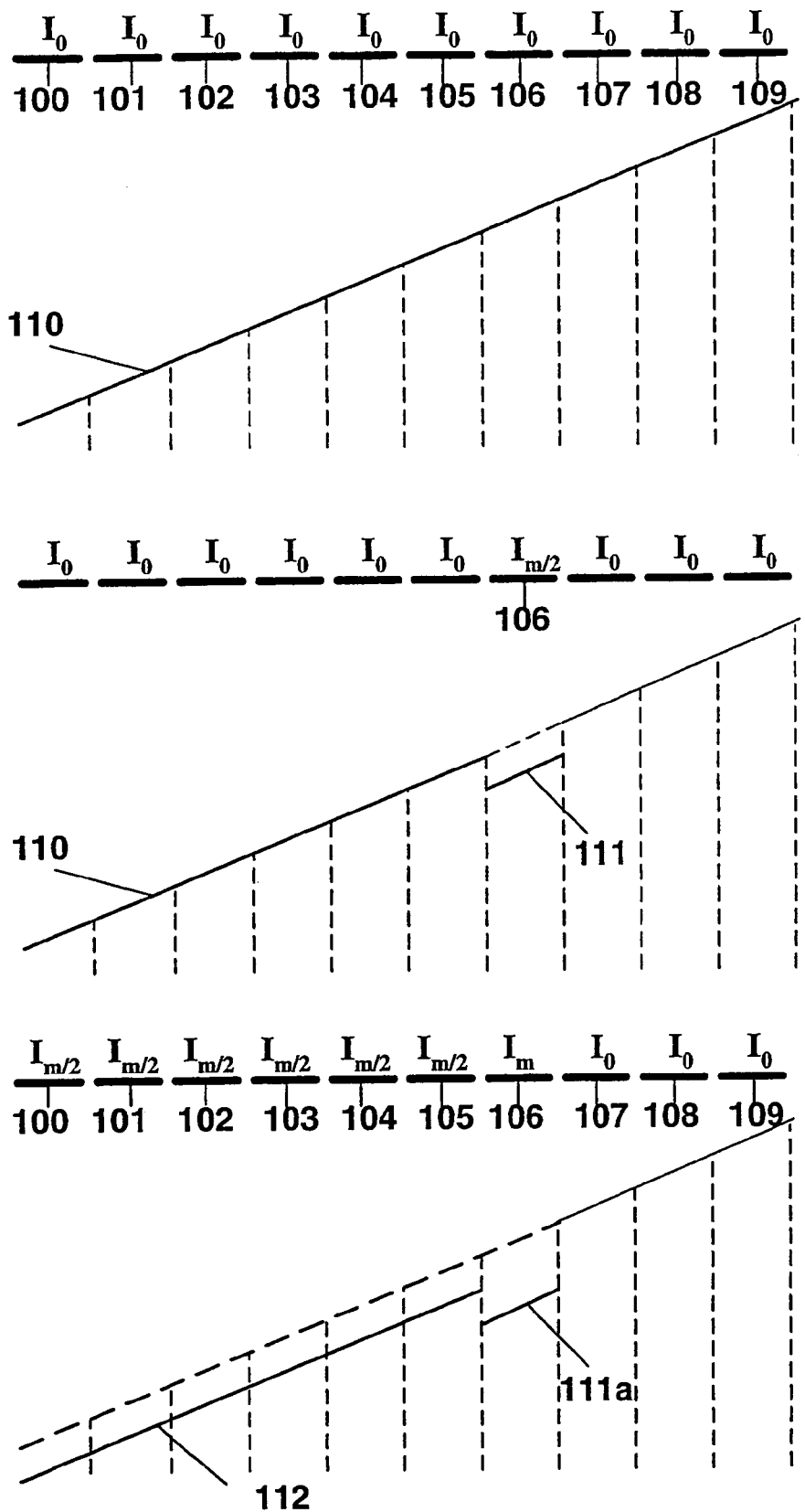
FIGS. 11 and 12 shows chirp line drawings.

FIG. 11 illustrates how this can be put into effect. In FIG. 11 there is shown the chirp grating which acts as a mirror under three different conditions.

In the drawing there are shown ten electrode positions 100 to 109, which correspond to the electrode positions 65 to 72 in FIG. 10. In other words, instead of there being eight electrodes over the rear grating, there are ten electrode positions in this schematic. The line 110 corresponds to the line 96 of the grating as shown in FIG. 10. The vertical dotted lines show the alignments of the electrodes and the portions of the chirp diagram.

In the upper portion of the FIG. 11 there is no current flowing through any of the electrodes 100 to 109. The line 110 is continuous with no portion being preferred.

In the central portion of FIG. 11 a current is passed through electrode 106. The current being half that required to cause the maximum reduction in the refractive index of the material of the chirp grating below the electrode 106 which is equivalent to material 86 in FIG. 10. The result of this is to displace downwards the portion 111 of the line 110. This results in a selection of a particular wavelength at which the chirp grating reflects in exactly the same manner as described above with reference to FIG. 10.

To further adjust the grating, so as to reduce the wavelength at which reflection occurs, current is passed through all of electrodes 100 to 105 and at the same time the current passing through electrode 106 is increased. This causes a lowering of the portion 112 of the chirp line below its original position, shown dotted. The portion 111a of the line 110 also is lowered at the same time, thus moving the point of selection to a lower wavelength. In best practice no additional current need be passed through electrodes 107 to 109, as they play no part in the reflecting process. However, since they play no part in the selection process, it is possible for the electrodes 107 to 109 to be lowered in amounts similar to electrodes 100 to 105 without interfering with the wavelength selectivity. When the current passing through the electrode 106 is the maximum which can be applied to reduce n, and thus the maximum amount of fine adjustment has occurred, the electrodes 100 to 105 will be passing a current which corresponds to half of the total reduction of n in the material in section 62 below electrodes 100 to 105.

To further adjust the wavelength at which the grating reflects, the current is removed from electrode 106 and is applied to the next adjacent electrode (or any other selected electrode) and the sequence of actions is repeated. By this means the grating can be adjusted over the entire 153 0nm to 157 0nm waveband.

Figure 12:
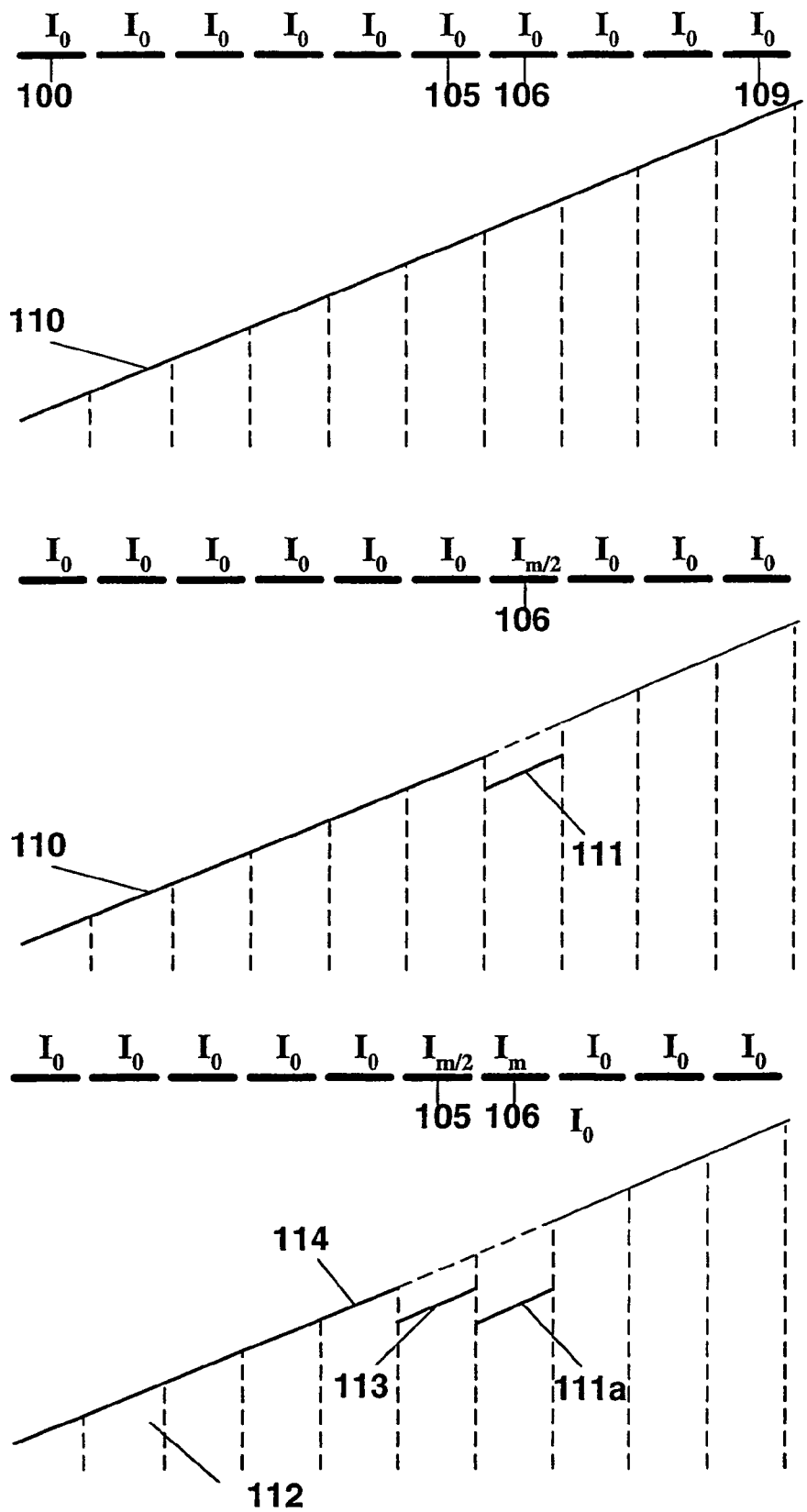

The selectivity of the chirp at a particular wavelength can be enhanced as shown schematically in FIG. 12. This figure is similar to FIG. 11 but shows what happens when two adjacent sections of the chirp grating are moved together.

In the upper portion of FIG. 12 the chirp grating is shown in the same position as in FIG. 11. This is also the case for the central portion of FIG. 12, where current applied to electrode 106 has caused a lowering of the line 111 to the position half way down to its maximum extent. If the current is passed through electrode 105 this causes the line 113 to be lowered and the current passing through electrode 106 is increased at the same rate so that lines 111a and 113 move down in synchronism. This means that the grating selectivity is increased by the enhanced reflectivity.

When the applied current to electrode 105 is half of that applied to electrode 106 and the line 111a is depressed to its maximum extent the lines 111a and 113 will also coincide with portion 114 of line 110 to give a three-region coincidence.

It will be appreciated that the more electrodes that can be installed over the chirp, the greater the number of regions that can be brought into coincidence and the smaller each reduction in n needed at any point to adjust the chirp. For a range of 40 nm total adjustment, if say, twelve different electrode positions were used, then each would only be required to adjust through a range of 4 nm to cover the entire band with a degree of wavelength margin at the band edges.

The inter-relationship of the front and rear reflectors is most easily understood with reference to FIG. 13.

These drawings in FIG. 13 show one above the other the combs of reflectance produced by the front and rear reflectors. In the drawings the intensity of reflectance I is plotted vertically against wavelength $\lambda$. FIG. 13a shows the intensity of reflectance (reflectivity) I produced by the chirped grating beneath electrodes 65 to 72 in its passive condition i.e. no current applied to electrodes 65 through 72. This substantially uniform reflectivity 200 is positioned directly over the comb of reflectances 65a to 72a shown in FIG. 13b, which is produced by the rear grating 51 in the laser of FIG. 3. The smoothness of the reflectivity profile shown in FIG. 13a is idealised and in practice will have structure associated with manufacturing tolerances. This structure, and any noise, will be significantly smaller in intensity compared to the controlled peaks which will be created in the front and rear reflectors.

If only just sufficient current is injected into the gain section to make it generate light, the laser will not lase because the intensity of the light at all of the wavelengths represented by the peaks 65a to 72a being the peaks from the rear reflector (and of course all other wavelengths) is below the lasing threshold.

To get the laser to lase predictably, it is necessary to have both a population inversion of charge carriers within the gain material and to get at least one, and preferably only one, wavelength to be above the lasing threshold. This is achieved by injecting sufficient current into the gain section 61 through electrode 64 to create the population inversion and by making a portion of the front grating reflect light of a specific wavelength preferentially, so that the rear grating selectively reflects light of that particular wavelength. The front grating will reflect back the light of that wavelength, so that that wavelength will become the preferred or enhanced wavelength and the laser will commence to lase at that wavelength.

This is carried out as follows.

The material of which layer 3 is formed in the sections 50 and 62 is such as to experience a reduction in refractive index when an electrical current is passed through it. If sufficient current is passed through electrode 68 to cause the wavelength of reflectivity of the grating below that electrode to superimpose and reinforce with the reflectivity of the grating below electrode 67 then a reflectivity peak 201 in the front reflector response is produced as shown in FIG. 13c.

Now if current is also passed through the electrode 64 to create light in the gain section 61 at an intensity above the lasing threshold, the light at a wavelength corresponding to the peak 201 is selectively reinforced and the laser will commence to lase at the wavelength E as shown in FIG. 13d. Thus the laser will be tuned to that wavelength. An advantage of this laser design is that the breadth of the front mirror peak can be sufficiently broad that tuning may be affected solely by the rear grating tuning current, within the wavelength window defined by the broad front mirror peaks.

If a current is now passed through electrode 52 this will move the whole comb of peaks 65a to 72a including peak F to lower wavelengths as shown in FIG. 13e. The peak F will have a slightly reduced intensity compared to peak E because the maxima of the peaks of the front and rear reflectors are no longer exactly aligned.

If at the same time a current is passed through electrode 67 and the current passing through electrode 68 is increased, then the peak 201 in FIG. 13c will also move to a lower wavelength and thus the maxima of the peaks of the front and rear, reflectors can be brought back into exact alignment.

Thus the laser can be fine tuned to lase at wavelengths between the peaks 65a to 72a as shown in FIG. 13b.

It will be appreciated that the peak 201 cannot exist effectively at the extreme long wavelength end of the chirped Bragg grating corresponding to the grating below electrode 72 of FIG. 3.

To ensure complete band coverage out of band, or edge-of-band, segments can be employed. The long wavelength out-of-band segment being provided with a tuning electrode, so that it can, by means of current injection, be driven to coincide with the first in-band long wavelength segment. The short wavelength out-of-band segment does not of necessity need to be provided with an electrode, as its operation at this lasing wavelength, is determined by driving current into the shortest wavelength in-band segment. The short wavelength out-of-band segment does need to be provided with an electrode if required to be fine tuned. Incorporation of these out-of-band, or edge-of-band segments allows for production spread in operating characteristics and helps improve production yields.

With InP, as a typical Group III-V laser material the reduction in material refractive index through current injection permits wavelength tuning in the range of 1–10 nm. Using such material the tuning segments will typically be designed at 4 nm wavelength spacing. With such an arrangement to produce coincidence with its next lowest wavelength neighbour requires 4 nm wavelength shift of a segment, whilst leaving a further 4 nm coincident tuning capability. By this means the whole band of interest may be covered.

The lasers as set out in the embodiments do not have a constant cavity length as they go from one supermode to another, which can result in mode hopping if great care is not taken to avoid it. The function of the phase change section 60 is to compensate for these variations in the optical path length as the laser is tuned. The section 60 is also formed of a material which will reduce in refractive index when a current is passed through it, and current can be passed through electrode 63 to affect such a change.

Thus the laser of the invention is capable of coarse tuning from one peak 65a to 72a as shown in FIG. 13b and also fine-tuning of the peaks to lower wavelengths in a simple and effective manner.

Although the above description refers to the use of a phase shifted grating distributed Bragg reflector for the rear mirror, a sampled segmented grating distributed Bragg reflector could be used. A phase shifted grating distributed Bragg reflector is preferred because the reflection peaks of the comb produced by such a distributed Bragg reflector is substantially flat and uniform. With a sampled segmented grating distributed Bragg reflector, as utilised in U.S. Pat. No. 4,896,325, on the other hand the reflection spectrum has a Sinc squared envelope, which means that the lasers with such an output distribution cannot be reliably operated over such a wide optical bandwidth as those using a phase shifted grating distributed Bragg reflector as the rear mirror.

In normal operation light output is coupled from the front of the laser adjacent to the gain section, and a small amount of light maybe taken from the rear of the laser adjacent the Bragg grating(s) for auxiliary purposes such as wavelength locking. However, nothing is meant to imply that implementations with light primarily coupled out of the rear of the laser are precluded from the scope of the invention.

It is preferred that the reflectivity of the rear mirror be as high as possible, typically in the range 50% to 80%. On the other hand the reflectivity of the front mirror should be lower, and typically in the range 20% to 40%.

The invention claimed is:

1. A tuneable laser having a gain section bounded at one end by a tunable first Bragg reflector in the form of a distributed Bragg reflector adapted to produce a comb of reflective peaks and at the other end by a tunable second distributed Bragg reflector, the second distributed Bragg reflector adapted to reflect at a plurality of wavelengths, wherein one or more wavelengths of reflective peaks of the first distributed Bragg reflector substantially coincide with one or more wavelengths at which the tunable second distributed Bragg reflector reflects prior to each of the first and second distributed Bragg reflectors being tuned, and wherein the second distributed Bragg reflector is capable of being tuned selectively through discrete segments so that one or more segments of the second distributed Bragg reflector can be tuned to a lower wavelength to reflect with a further segment of the second distributed Bragg reflector reflecting at that lower wavelength to enhance the reflectivity at that lower wavelength, the lower wavelength substantially coinciding with a peak of the first distributed Bragg reflector, thereby causing the laser to lase at that lower wavelength.

2. The tuneable laser as claimed in claim 1, wherein the second distributed Bragg reflector is formed in a material having a variable refractive index and in which the tuning of the reflected wavelength is effected by varying the refractive index of the material.

3. The tuneable laser as claimed in claim 2, wherein the refractive index is varied by passing an electrical current through the material in which the second distributed Bragg reflector is formed.

4. The tuneable laser as claimed in claim 3, wherein the second distributed Bragg reflector is a chirped grating and is formed in a material having a refractive index variable in response to the passage of current therethrough, further comprising a plurality of external electrodes disposed along a length of the grating, wherein each electrode is adapted to be selectively connectable to a power source.

5. The tuneable laser as claimed in claim 4, wherein the chirped grating comprises a linear chirp of progressive pitch variation along the chirp with the shortest pitch closest to the gain section.

6. The tuneable laser as claimed in claim 4, wherein the chirped grating is partitioned into chirp segments each consisting of part of the over all chirp grating, wherein all chirp segments are concatenated.

7. The tuneable laser as claimed in claim 3, wherein the second distributed Bragg reflector comprises a plurality of discrete grating segments, at least two of which grating segments have a different pitch, wherein current is applicable to at least the grating segment having a longer pitch such that an effective wavelength of the grating segment having the longer pitch can be tuned to a wavelength of the grating segment having a shorter pitch.

8. The tuneable laser as claimed in claim 3, wherein the second distributed Bragg reflector comprises a plurality of discrete grating segments, each grating segment having a different pitch, such that the grating segment closest to the gain section has the shortest pitch, and the pitch of each successive grating segment from the gain section being greater than the pitch of the preceding segment.

9. The tuneable laser as claimed in claim 8, wherein each grating segment comprises an independently actuable electrode.

10. The tuneable laser as claimed in claim 9, further comprising a switching circuit to switch the current to the electrode.

11. A tuneable laser according to claim 1, manufactured using semiconductor materials.

12. A tuneable laser according to claim 11, manufactured using a Group Ill-V semiconductor material.

13. A tuneable laser according to claim 1, manufactured using electron beam writing techniques.

14. A tuneable laser according to claim 1, manufactured using a holographic phase grating plate.

15. The tuneable laser as claimed in claim 1, wherein the first distributed Bragg reflector is a long reflector, and the segments in the second distributed Bragg reflector are each kept short so that the cumulative waveguide length associated therewith is minimized, thereby keeping the waveguide losses low.

16. The tuneable laser as claimed in claim 1, wherein the distributed Bragg reflector forming the first reflector is a phase shifted Bragg grating reflector.

17. The tuneable laser as claimed in claim 1, wherein light is emitted through the second distributed Bragg reflector.

18. The tuneable laser as claimed in claim 1, further comprising a phase change section disposed between the gain section and at least one of the distributed Bragg reflectors.

19. The tuneable laser as claimed in claim 18, wherein the phase change section is located between the gain section and the first or second distributed Bragg reflector.

20. The tuneable laser as claimed in claim 19, wherein the phase change section has an electrode to permit passage of current through the phase change section to alter a refractive index of a material of the phase change section to effect the phase change.

21. The tuneable laser as claimed in claim 1, wherein the first distributed Bragg reflector is a sampled segmented distributed Bragg reflector grating.

22. The tuneable laser as claimed in claim 1, wherein the first distributed Bragg reflector is tunable such that the whole comb of reflective peaks move to lower wavelengths.

23. The tuneable laser as claimed in claim 1, wherein the enhanced reflectivity caused by the one or more segments of the second distributed Bragg reflector being tuned to a lower wavelength to reflect with a further segment of the second distributed Bragg reflector reflecting at the lower wavelength comprises a broader range of wavelengths than the coinciding reflective peak of the first distributed Bragg reflector.

24. The tuneable laser as claimed in claim 6, wherein each chirp segment comprises an independently actuable electrode.

25. A method for tuning a laser, the method comprising the steps of:
providing a first distributed Bragg reflector to produce a comb of reflective peaks;
providing a tuneable second distributed Bragg reflector with discrete segments to reflect at a plurality of wavelengths;
providing the tunable second distributed Bragg reflector such that one or more wavelengths at which the second distributed Bragg reflector reflects substantially coincide with one or more wavelengths of the reflective peaks of the first distributed Bragg reflector prior to each of the first and second distributed Bragg reflectors being tuned;
selectively tuning the second distributed Bragg reflector through the discrete segments so that one or more of the discrete segments of the second distributed Bragg reflector is tuned to a lower wavelength to reflect with a further segment of the second distributed Bragg reflector to enhance the reflectivity at that lower wavelength, the lower wavelength substantially coinciding with a reflective peak of the first distributed Bragg reflector, thereby causing the laser to lase at that lower wavelength.

26. The method as claimed in claim 25, wherein the second distributed Bragg reflector is formed in a material having a variable refractive index and the method further comprises the step of varying the refractive index of the material to effect the tuning of the reflecting.

27. The method as claimed in claim 26, wherein the method further comprises: passing an electrical current through the material in which the second distributed Bragg reflector is formed to vary the refractive index.

28. The method as claimed in claim 27, wherein the second distributed Bragg reflector is a chirped grating and is formed in a material having a refractive index variable in response to the passage of current therethrough.

29. The method as claimed in claim 25, wherein the method further comprises:

minimizing a cumulative waveguide length and waveguide losses associated with the segments in the second distributed Bragg reflector by keeping the segments of the second distributed Bragg reflector short.

* * * * *